United States Patent
Anderson et al.

(10) Patent No.: US 12,267,989 B2
(45) Date of Patent: Apr. 1, 2025

(54) METHOD AND SYSTEM FOR CONTROLLING ELECTRIC DRIVE SYSTEM ACCORDING TO PREDICTED TEMPERATURE OF INVERTER BUSBAR

(71) Applicant: FORD GLOBAL TECHNOLOGIES, LLC, Dearborn, MI (US)

(72) Inventors: Monty J. Anderson, Boise, ID (US); William Robert Brown, Huntington Woods, MI (US); Papiya Bagchi, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 476 days.

(21) Appl. No.: 17/668,494

(22) Filed: Feb. 10, 2022

(65) Prior Publication Data

US 2023/0255006 A1 Aug. 10, 2023

(51) Int. Cl.
*H02P 21/22* (2016.01)
*H02P 27/06* (2006.01)
*H05K 7/20* (2006.01)

(52) U.S. Cl.
CPC ......... *H05K 7/20945* (2013.01); *H02P 21/22* (2016.02); *H02P 27/06* (2013.01)

(58) Field of Classification Search
CPC ...... H02P 27/06; H02P 21/22; H05K 7/20945
See application file for complete search history.

(56) References Cited

U.S. PATENT DOCUMENTS

| 7,215,023 B2 | 5/2007 | Baeumel |
| 11,368,083 B2 | 6/2022 | Appel |
| 11,811,349 B2 | 11/2023 | Anderson |
| 2002/0175653 A1 | 11/2002 | Elliot |
| 2004/0027076 A1 | 2/2004 | Shimizu |

(Continued)

FOREIGN PATENT DOCUMENTS

| EP | 2453571 A1 * | 5/2012 | ............ H02P 27/08 |
| EP | 3859357 A1 | 8/2021 | |

(Continued)

OTHER PUBLICATIONS

Sato, Output Control Equipment of Power Station, 1993, Full Document (Year: 1993).*

(Continued)

*Primary Examiner* — Nael N Babaa
(74) *Attorney, Agent, or Firm* — David B. Kelley; Brooks Kushman P.C.

(57) ABSTRACT

A controller reduces power output of an inverter of an electric drive system while a sensed temperature associated with the inverter, a sensed current output of the inverter, and parameter values of a busbar of the inverter are indicative of a predicted temperature of the busbar being greater than a threshold to maintain busbar temperature lower than the threshold. The current output of the inverter may be outputted over the busbar. The parameter values are obtainable from a thermal model of the busbar. The thermal model may be derived from testing a test version of the inverter under different drive cycles in which for each a set of information is recorded including a sensed temperature of the test inverter, a sensed current output of the test inverter, and a sensed temperature of the busbar of the test inverter.

13 Claims, 5 Drawing Sheets

(56) References Cited

U.S. PATENT DOCUMENTS

| | | |
|---|---|---|
| 2006/0178852 A1 | 8/2006 | Johns et al. |
| 2009/0052210 A1 | 2/2009 | Ward et al. |
| 2009/0063070 A1 | 3/2009 | Renneberg |
| 2012/0016547 A1 | 1/2012 | Aridome |
| 2012/0021263 A1 | 1/2012 | Nishi |
| 2015/0236616 A1 | 8/2015 | Aldinger |
| 2015/0256105 A1 | 9/2015 | Kano |
| 2016/0266189 A1 | 9/2016 | Yoshida |
| 2017/0125998 A1 | 5/2017 | Tiziani |
| 2017/0217313 A1* | 8/2017 | Hashimoto ............. B60L 50/61 |
| 2019/0244445 A1 | 8/2019 | Kyes |
| 2019/0319571 A1* | 10/2019 | Kim ................... H02M 7/5387 |
| 2020/0007066 A1 | 1/2020 | Gondo |
| 2020/0100400 A1 | 3/2020 | He et al. |
| 2020/0111610 A1 | 4/2020 | Haas et al. |
| 2020/0204061 A1 | 6/2020 | Minesawa |
| 2020/0379057 A1 | 12/2020 | El Hayek |
| 2021/0018016 A1 | 1/2021 | Kim et al. |
| 2021/0178908 A1 | 6/2021 | Kim |
| 2022/0200512 A1 | 6/2022 | Anderson |
| 2022/0365143 A1 | 11/2022 | Schroth |
| 2023/0255006 A1 | 8/2023 | Anderson |

FOREIGN PATENT DOCUMENTS

| | | | | |
|---|---|---|---|---|
| JP | H06296399 A1 | * | 10/1994 | ............. B60L 58/12 |
| JP | 2020123999 A | | 8/2020 | |
| WO | WO-2022109699 A1 | * | 6/2022 | ................ H02P 1/04 |

OTHER PUBLICATIONS

Soares, Starting methods for bldc motors applied on reciprocating compressors, 2020, Full Document (Year: 2020).*

Fardel, Converter and method for driving an electric AC machine, 2010, Full Document (Year: 2010).*

Non Final Office Action for U.S. Appl. No. 17/590,237, dated Sep. 19, 2024, 22 Pages.

* cited by examiner

Thermal Block Diagram

METHOD AND SYSTEM FOR CONTROLLING ELECTRIC DRIVE SYSTEM ACCORDING TO PREDICTED TEMPERATURE OF INVERTER BUSBAR

TECHNICAL FIELD

The present invention relates to controlling an inverter of an electric drive system according to a predicted temperature of a busbar of the inverter.

BACKGROUND

An electric drive system includes a battery, an inverter, and a motor. The inverter has at least one busbar connected to the motor. The inverter converts electrical power input from the battery into a desired electrical power to output over the busbar to the motor.

SUMMARY

An electric drive system includes an inverter and a controller. The inverter has a busbar. The controller is configured to reduce power output of the inverter while a sensed temperature associated with the inverter, a sensed current output of the inverter, and parameter values of the busbar are indicative of a predicted temperature of the busbar being greater than a threshold to maintain busbar temperature lower than the threshold.

The parameter values of the busbar are obtainable from a thermal model of the busbar.

In an embodiment, the sensed temperature associated with the inverter is a sensed temperature of a power switch of the inverter, and the thermal model of the busbar is derived from testing a test version of the inverter under different drive cycles in which for each drive cycle a set of information is recorded including a sensed temperature of the power switch of the test version of the inverter, a sensed current output of the test version of the inverter, and a sensed temperature of the busbar of the test version of the inverter.

In this embodiment, the parameter values of the busbar are obtained from the thermal model of the busbar by finding which values of a busbar temperature thermal equation having variables of power switch temperature, inverter current output, and the parameters fit the set of information recorded for at least one of the drive cycles.

In an embodiment, the current output of the inverter is outputted over the busbar.

The inverter may include more than one busbar. For example, the inverter may be a three-phase inverter having three busbars, with one busbar for each phase of the inverter.

The temperature of the power switch of the inverter may be sensed by a temperature sensor incorporated with the power switch. The controller is in communication with the temperature sensor. The power switch of the inverter may be an insulated gate bipolar transistor (IGBT).

The current output of the inverter may be sensed by a current sensor of the inverter. The controller is in communication with the current sensor.

The controller may be configured to reduce power output of the inverter by de-rating operation of the inverter.

In an embodiment, the inverter is configured to convert an input electrical power received from a battery and/or a fuel cell system into an output electrical power and provide, via at least the busbar, the output electrical power to a motor.

A vehicle includes an electric drive system and a controller. The electric drive system includes a traction battery, a power electronics module including a DC-link capacitor and an inverter, and a motor. The inverter includes a busbar. The inverter is configured to convert an input electrical power received from the traction battery, via the DC-link capacitor, into an output electrical power and provide the output electrical power, via at least the busbar, to the motor for propelling the vehicle. The controller is configured to predict a temperature of the busbar using a sensed temperature associated with the inverter, a sensed current output of the inverter, and parameter values obtained from a thermal model of the busbar. The controller is further configured to de-rate the electric drive system while the predicted temperature of the busbar is greater than a temperature threshold.

A method for an electric drive system including an inverter having a busbar includes sensing a temperature associated with the inverter and sensing a current output of the inverter. The method further includes reducing power output of the inverter while the sensed temperature of the inverter, the sensed current output of the inverter, and parameter values of a busbar of the inverter are indicative of a predicted temperature of the busbar being greater than a threshold to maintain busbar temperature lower than the threshold. The parameter values of the busbar are obtainable from a thermal model of the busbar.

As described herein, the temperature of a busbar of an inverter of a production electric drive system should not exceed a predetermined high temperature threshold. Furthermore, it is often economically desirable to not have hardware dedicated to measuring the temperature of the busbar.

In accordance with embodiments of the present invention, the temperature of a busbar of an inverter of a production electric drive system can be well estimated using: (i) a thermal model of a busbar of the inverter ("busbar thermal model") containing relatively few constant parameters; (ii) the temperature of one or more power switches of the inverter (in embodiments, the power switches are insulated gate bipolar transistors (IGBTs) and each have at least one temperature sensor embedded into the power switch hardware); and (iii) a current output of the inverter.

The parameters of the busbar thermal model are determined by using one or more "test" inverters. A test inverter is a test version of the inverter of production electric drive systems. The test inverter has been instrumented with additional thermal sensors (e.g., thermocouples), including direct measurement of the busbar temperature, for the purpose of calibration work. The instrumented test inverter is driven through a plurality of cycles that cause the inverter to operate near capability limits (typically high current cycles (e.g., repeated hard accelerations, trailer tow, steep climbs, etc.)). The parameters of the busbar thermal model are then found via a best fit relationship between busbar temperature, power switch temperature, and inverter current output. The parameters of the busbar thermal model can also be estimated from complex CAE thermal models of the busbar.

In an inverter of a production electric drive system (i.e., a production inverter), the busbar temperature is estimated (i.e., predicted) and repeatedly updated by a controller of the inverter system. This estimate is provided to other control software responsible for inverter hardware protection and compared against a busbar temperature limit threshold. When necessary, action can then be taken to prevent the busbar and/or other components of the inverter from exceeding a threshold temperature (e.g., temporarily de-rating the electric current capability of the inverter).

The busbar thermal model is superior to alternative strategies for busbar and inverter hardware protection which alternative strategies include: (a) directly measuring the temperature of the busbar in a production inverter—this increases hardware complexity and expense; and (b) protecting the busbar and other components of the inverter from excess temperature by preventing the inverter from exceeding average current vs. time thresholds—this approach is based on worst case thermal conditions and can be overly conservative, causing the inverter to de-rate even when the busbar is well below its temperature threshold (e.g., unnecessary reduction in vehicle performance).

In the exemplary embodiments described and illustrated herein, the inverter is part of an electric vehicle. However, in accordance with embodiments of the present invention, the inverter is applicable more broadly to any inverter system (including applications other than vehicle applications) where a busbar(s) of the inverter requires thermal protection, but dedicated hardware is undesirable and time-based current limits are too conservative.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
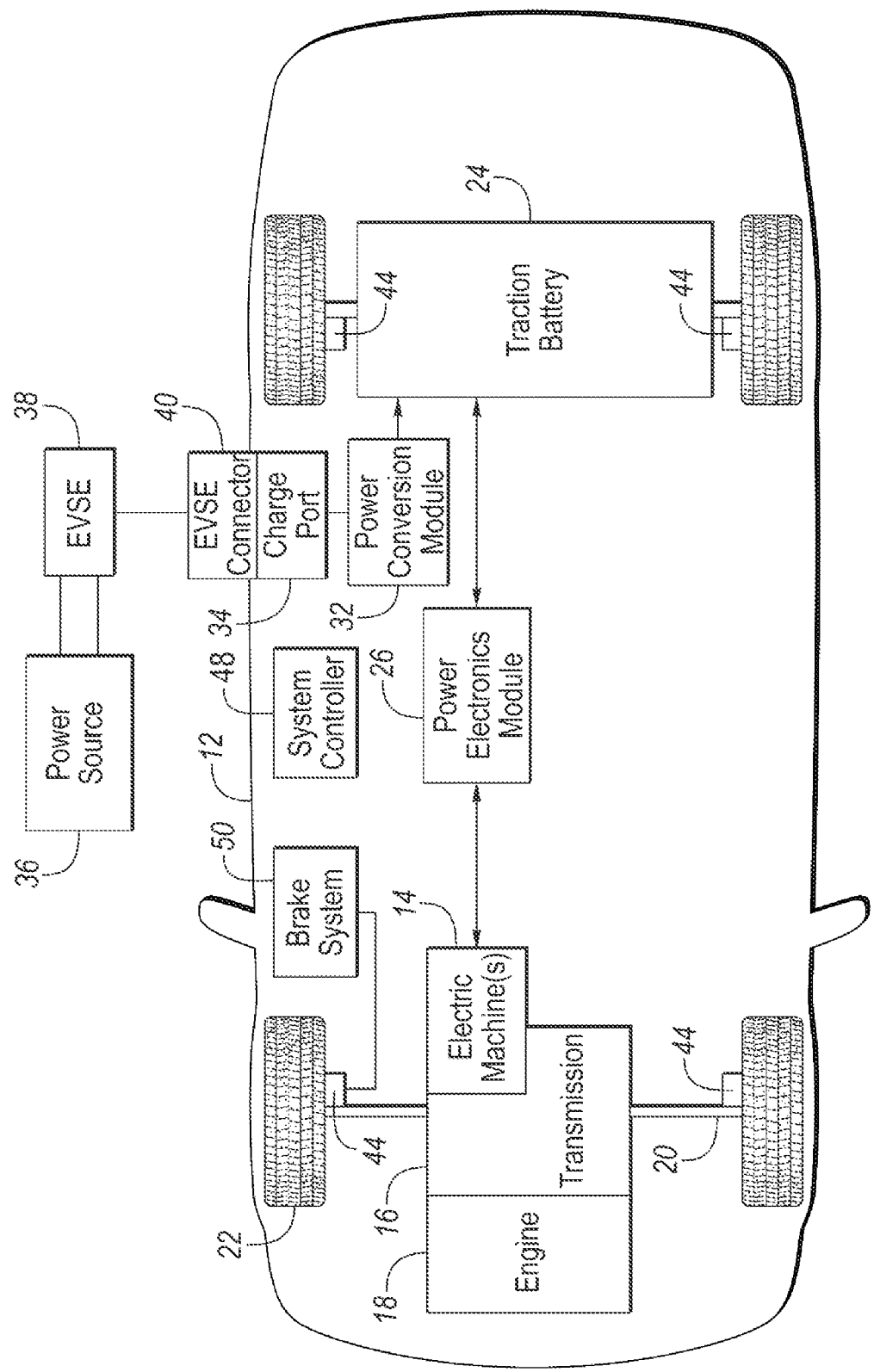
FIG. 1 illustrates a block diagram of an electric vehicle.

Referring now to FIG. 1, a block diagram of an exemplary electric vehicle ("EV") 12 is shown. In this example, EV 12 is a plug-in hybrid electric vehicle (PHEV). EV 12 includes one or more electric machines 14 ("e-machines") mechanically connected to a transmission 16. Electric machine 14 is capable of operating as a motor and as a generator. Transmission 16 is mechanically connected to an engine 18 and to a drive shaft 20 mechanically connected to wheels 22. Electric machine 14 can provide propulsion and slowing capability while engine 18 is turned on or off. Electric machine 14 acting as a generator can recover energy that may normally be lost as heat in a friction braking system. Electric machine 14 may reduce vehicle emissions by allowing engine 18 to operate at more efficient speeds and allowing EV 12 to be operated in electric mode with engine 18 off under certain conditions.

A traction battery 24 ("battery) stores electrical energy that can be used by electric machine 14 for propelling EV 12. Battery 24 typically provides a high-voltage (HV) direct current (DC) output. Battery 24 is electrically connected to a power electronics module 26. Power electronics module 26 is electrically connected to electric machine 14 and provides the ability to bi-directionally transfer energy between battery 24 and the electric machine. For example, battery 24 may provide a DC voltage while electric machine 14 may require a three-phase alternating current (AC) current to function. Power electronics module 26 may convert the DC voltage to a three-phase AC current to operate electric machine 14. In a regenerative mode, power electronics module 26 may convert three-phase AC current from electric machine 14 acting as a generator to DC voltage compatible with battery 24.

Battery 24 is rechargeable by an external power source 36 (e.g., the grid). Electric vehicle supply equipment (EVSE) 38 is connected to external power source 36. EVSE 38 provides circuitry and controls to control and manage the transfer of energy between external power source 36 and EV 12. External power source 36 may provide DC or AC electric power to EVSE 38. EVSE 38 may have a charge connector 40 for plugging into a charge port 34 of EV 12. Charge port 34 may be any type of port configured to transfer power from EVSE 38 to EV 12. A power conversion module 32 of EV 12 may condition power supplied from EVSE 38 to provide the proper voltage and current levels to battery 24. Power conversion module 32 may interface with EVSE 38 to coordinate the delivery of power to battery 24. Alternatively, various components described as being electrically connected may transfer power using a wireless inductive coupling.

Wheel brakes 44 are provided for slowing and preventing motion of EV 12. Wheel brakes 44 are part of a brake system 50. Brake system 50 may include a controller to monitor and control wheel brakes 44 to achieve desired operation.

The various components discussed may have one or more associated controllers to control and monitor the operation of the components. The controllers can be microprocessor-based devices. The controllers may communicate via a serial bus (e.g., Controller Area Network (CAN)) or via discrete conductors. For example, a system controller 48 (i.e., a vehicle controller) is present to coordinate the operation of the various components.

As described, EV 12 is in this example is a PHEV having engine 18 and battery 24. In other embodiments, EV 12 is a battery electric vehicle (BEV). In a BEV configuration, EV 12 does not include an engine. Additionally, EV 12 may further include a fuel cell system configured to provide electrical energy that can be used by electric machine 14 for propelling EV 12.

Figure 2:
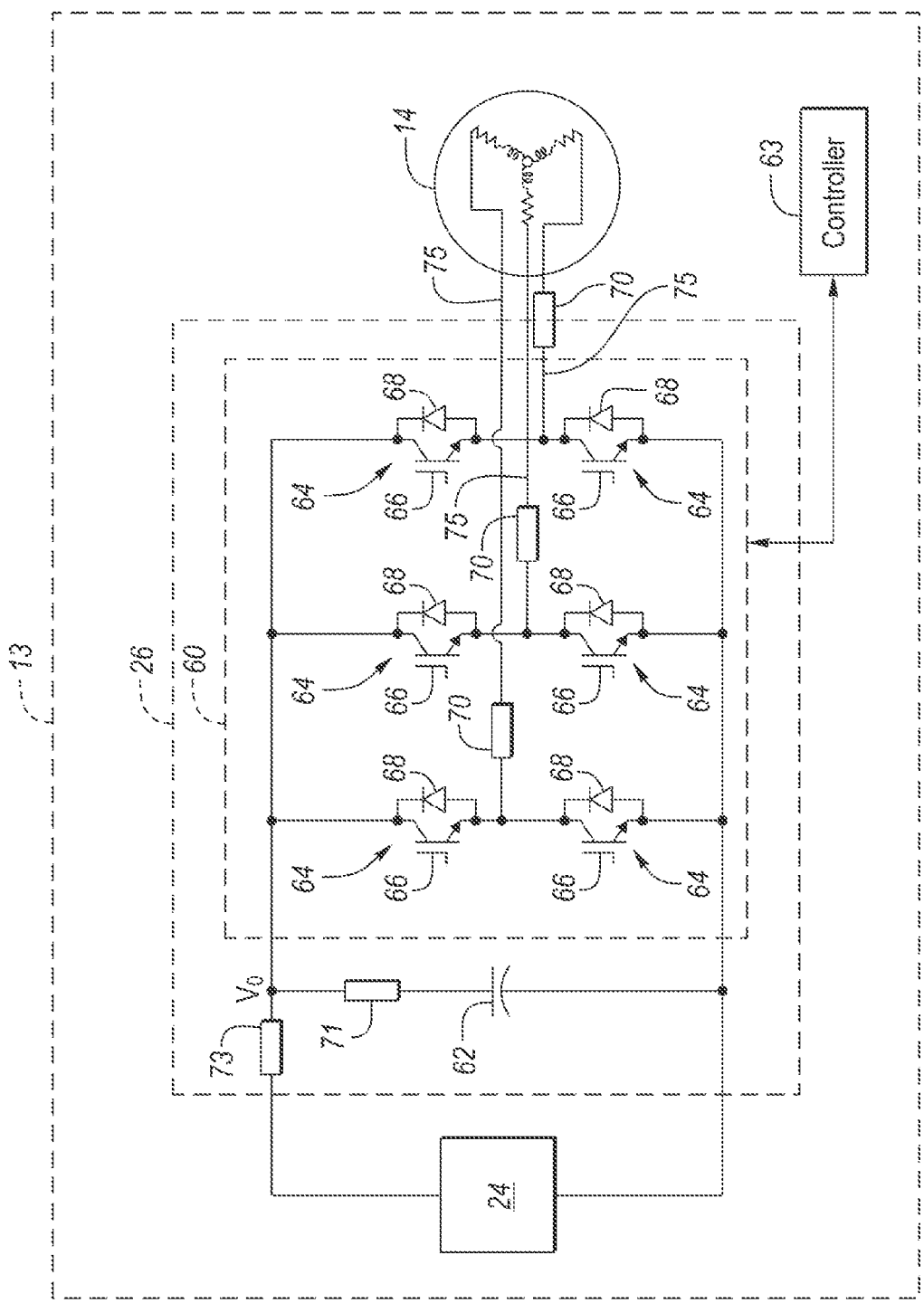
FIG. 2 illustrates a schematic diagram of components of an electric drive system of the electric vehicle, the components of the electric drive system including a traction battery, a power electronics module having a DC-link capacitor and an inverter, and a motor.
Figure 3:
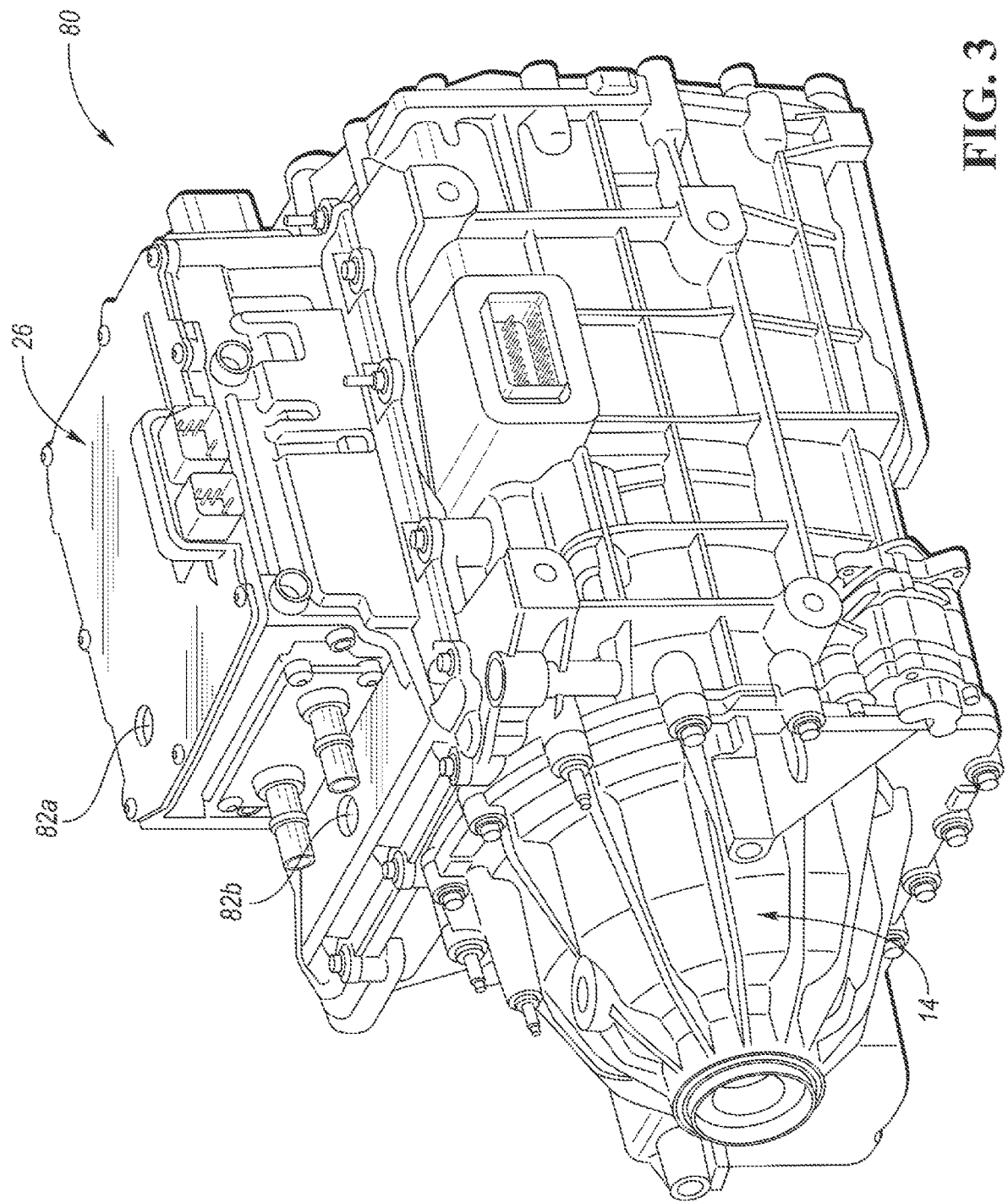
FIG. 3 illustrates a perspective view of a test version of an eDrive unit of the electric drive system, the eDrive unit including the power electronics module and the motor of the electric drive system.

Referring now to FIG. 2, with continual reference to FIG. 1, a schematic diagram of components of an electric drive system 13 of EV 12 is shown. As shown in FIG. 2, electric drive system 13 includes traction battery 24, power electronics module 26, and electric machine (i.e., "motor") 14. Power electronics module 26 and motor 14 may be assembled together and thereby form an "eDrive" unit of electric drive system 13, such as shown in FIG. 3.

As described above, power electronics module 26 is coupled between battery 24 and motor 14. Power electronics module 26 converts DC electrical power provided from battery 24 (and DC electrical power from a fuel cell system, if present) into AC electrical power for providing to motor 14. In this way, power electronics module 26 drives motor 14 with power from battery 24 for the motor to propel EV 12.

Power electronics module 26 includes a DC-link capacitor 62 and an inverter 60 (or "inverter control system" ("ICS")). Inverter 60 shown in FIG. 2 is an exemplary inverter. DC-link capacitor 62 is disposed between battery 24 and inverter 60 and is connected in parallel with battery 24. DC-link capacitor 62 is operable to absorb ripple currents generated by operation of power switches of inverter 60 and stabilize a DC-link voltage Vo for inverter 60 control.

As known to those of ordinary skill, inverters convert DC power to single or multiphase AC power (three-phase AC power being most common and is illustrated in FIG. 2). Inverters can move electrical power in either direction (i.e., bi-directional) for driving (i.e., motoring) or electrically braking (i.e., generating) the electric machine. An inverter system is made up of a combination of power electronic hardware (switches) and control software (FIG. 2 is a representative drawing). Electrical current can be quickly adjusted by opening and closing the power switches of the inverter.

Many inverter systems, including inverters relevant to embodiments of the present invention such as inverter 60, perform closed loop current control to precisely control the e-machine. To achieve this, the electric current in each phase of the inverter is sensed with a current sensor and a corresponding signal is provided to the controller of the inverter system. A common approach is to sense all of the phases, but any one phase current can be inferred from knowledge of the other phase currents. The current sensor can use and/or be implemented in different technologies and current sensors 70 shown in FIG. 2, discussed below, are but one example. Such current sensors are typically integrated into the inverter.

Inverter 60 includes inverting circuitry and heat generating components such as a plurality of power switching units 64. As known to those of ordinary skill, in the exemplary example, inverter 60 includes three sets of pairs of power switching units 64 (i.e., three×two=a total of six power switching units 64 as shown in FIG. 2). Each set pair of power switching units 64 includes two power switching units 64 connected in series. Each power switching unit 64 includes a power switch 66, in the form a transistor, arranged anti-parallel with a diode 68. In this example, the transistor is an insulated gate bipolar transistor (IGBT). Each set pair of power switching units 64 is connected in parallel with battery 24 and DC-link capacitor 62 and thereby each set pair of power switching units forms a "phase" of inverter 60. In this way, inverter 60, having three set pairs of power switching units 64, is a three-phase inverter operable for converting DC electrical power from battery 24 into three-phase AC electrical power for providing to motor 14.

Further, each phase of inverter 60 includes a current sensor 70. For instance, each current sensor 70 is a resistive shunt connected in series with the output of the corresponding phase. Current sensors 70 are operable for sensing the electrical current ($I_{AC}$) outputted from the corresponding phases of inverter 60 to motor 14.

Power electronics module 26 has an associated controller 63. Controller 63 can be a microprocessor-based device. Controller 63 is configured to monitor operation of DC-link capacitor 62 and to monitor and control operation of inverter 60. Particularly, controller 63 is operable to control the operation of power switches 66 to cause inverter 60 to convert a given DC electrical power provided from battery 24 via DC-link capacitor 62 into a desired AC electrical power for providing to motor 14. Controller 63 is in communication with current sensors 70 to monitor the AC electrical power provided from inverter 60 to motor 14. Controller 63 uses information of current sensors 70 as feedback in controlling inverter 60 to output the desired AC electrical power to motor 14.

Power switches 66 are associated with temperature sensors (e.g., thermistors) (not shown) which directly measure the temperature of the power switches. For instance, each power switch 66 has embedded diodes therein which are configured to function as a temperature sensor operable for providing the temperature of the power switch. Controller 63 is in communication with these temperature sensors to monitor the temperatures of power switches 66. Controller 63 may control the operation of inverter 60 according to the monitored temperatures of power switches 66.

Each phase of inverter 60 includes a busbar 75 connected to the corresponding phase of motor 14 to thereby connect inverter 60 and motor 14 together. Busbar 75 may be embodied as a typical rectangular, current carrying busbar. However, busbar 75 may alternatively have some other form and/or may be embodied as a cable or the like. Notably, the temperature of busbar 75 is not directly measurable in a practical manner. Busbar 75 and other components of inverter 60 are to be protected from excessive temperature caused by the operation of the inverter in converting the input power to the output power. In accordance with embodiments, a busbar thermal model (i.e., a temperature schedule) is generated for use in a protection strategy such that the capability of electric drive system 13 is not unnecessarily limited as the case may be with the protection strategy of limiting the time during which inverter 60 operates at relatively high power (e.g., AC $I_{RMS}$) output levels. Accordingly, use of the busbar thermal model is intended to enable electric drive system 13 to be de-rated only when busbar 75 and/or other components of inverter 60 may exceed a threshold temperature.

Referring now to FIG. 3, with continual reference to FIGS. 1 and 2, a perspective view of a test version 80 of the eDrive unit of electric drive system 13 of EV 12 is shown. eDrive unit test version 80 includes a test power electronics module and a test motor assembled together. The test power electronics module includes a test inverter. For testing eDrive unit test version 80, pass-through holes 82a, 82b are provided for receiving thermocouples. A thermocouple is placed on the busbar of the test inverter. Thermocouples may be placed on current sensors and/or other components of the test inverter. Thermocouples may be placed on the coolant (e.g., glycol) inlet and outlet associated with the test power electronics module. The thermocouples are operable for directly measuring the temperature of the components on which the thermocouples are placed.

With the various thermocouples in place, eDrive unit test version 80 is run under a number of different high-current drive cycles with the temperature of the busbar of the test inverter and any other monitored components of the test inverter being recorded.

Figure 4:
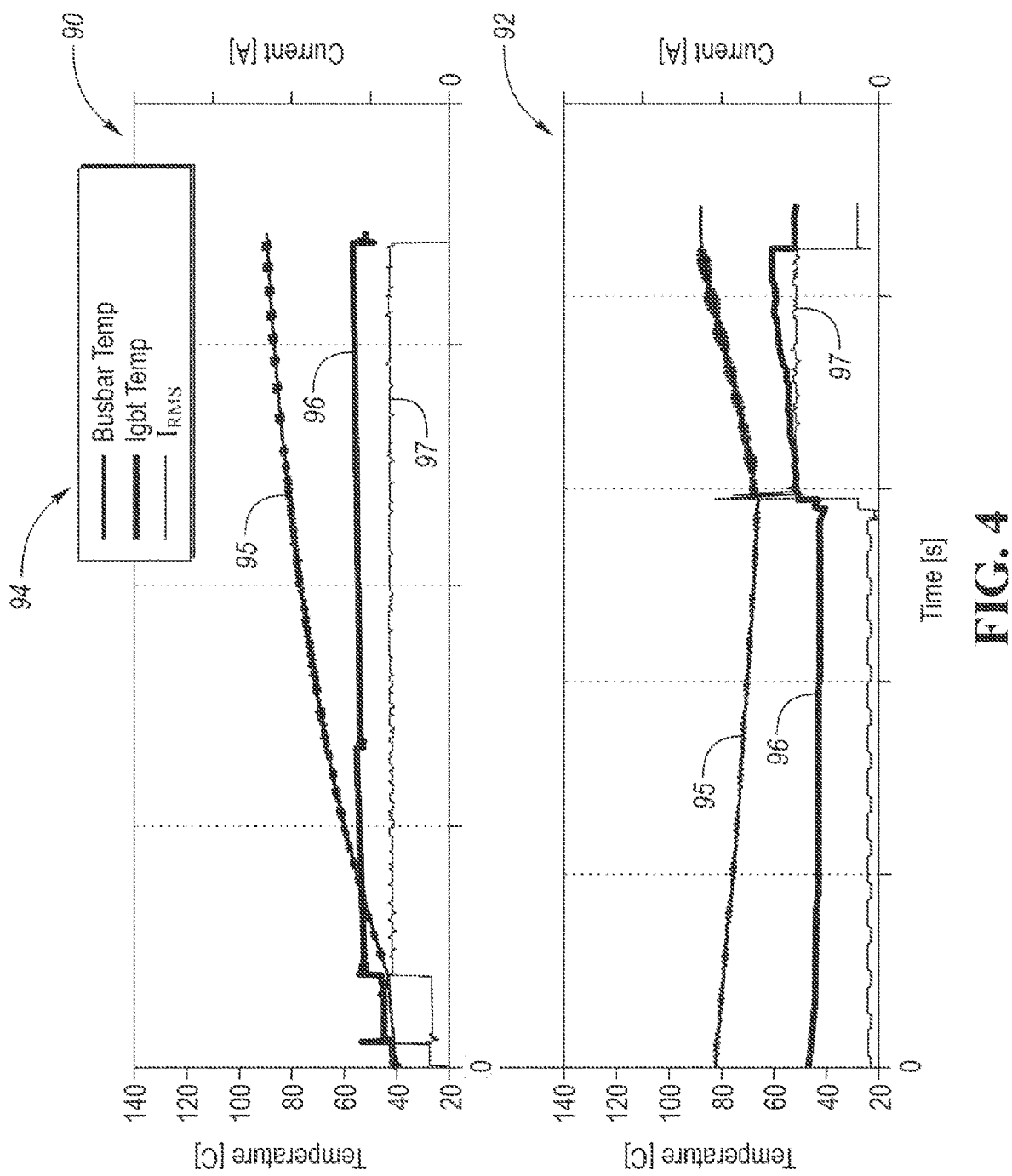
FIG. 4 illustrates a first exemplary graph of plotted information generated from testing the eDrive unit test version with a first high-current drive cycle, a second exemplary graph of plotted information generated from testing the eDrive unit test version with a different second high-current drive cycle, and a legend providing labeling for the plotted information.

FIG. 4 illustrates a first exemplary graph 90 of plotted information generated from testing eDrive unit test version 80 with a first one of the high-current drive cycles, a second exemplary graph 92 of plotted information generated from testing the eDrive unit test version with a different second one of the high-current drive cycles, and a legend 94 providing labeling for the plotted information. Of course, eDrive unit test version 80 may be tested with many other high-current drive cycles and/or may be retested with any of the high-current drive cycles. As such, any number of graphs could be generated from testing eDrive test unit version 80. First and second exemplary graphs 90 and 92, which pertain to the test results from testing eDrive unit test version 80 with respective first and second different high-current drive cycles, are simply provided in FIG. 4 as being representative of the testing of eDrive unit test version 80 with high-current drive cycles for an example for understanding the process for generating the busbar thermal model.

The plotted information of graphs 90 and 92, and as labeled in legend 94, includes a plot 95 of the temperature of the busbar ("Busbar Temp") of the test inverter as recorded while eDrive unit test version 80 is being run; a plot 96 of the temperature of one of the power switches ("$I_{gbt}$ Temp") of one of the switching units of the test inverter as recorded while eDrive unit test version 80 is being run. The one of the power switches is preferably the power switch having the highest temperature amongst all of the power switches. The plotted information of graphs 90 and 92, and as labeled in legend 94, further includes a plot 97 of an electrical current output ("$I_{RMS}$") of the test inverter as recorded while eDrive unit test version 80 is being run.

Other information recorded while eDrive unit test version 80 is being run, and which may also be part of the plotted information of graphs 90 and 92, includes the temperature(s) of other component(s) of inverter 60, the ambient temperature of the environment of the eDrive unit test version, the temperature of the stator coil of the test motor, the temperature of the coolant inlet and/or coolant outlets associated with the test power electronics module, and the like.

The plotted information of graphs 90 and/or 92 represents a thermal model of the busbar of the test inverter of eDrive unit test version 80. As eDrive unit test version 80 is the same type of eDrive unit as the eDrive unit of electric drive system 13 of EV 12, the busbar thermal model is representative of busbar 75 of inverter 60 of the electric drive system of the EV.

Accordingly, controller 63 predicts the temperature of busbar 75 of inverter 60 of electric drive system 13 of EV 12 by using (i) the measured temperature of a power switch 66 (i.e., IGBT temperature) of inverter 60, (ii) the measured current output of inverter 60 (i.e., $I_{RMS}$), and (iii) the values of the unknown parameters determined from the busbar thermal model. In this way, controller 63 uses the busbar thermal model and the known sensed (i.e., measured) quantities, IGBT temperature ($T_{IGBT}$) and inverter current output ($I_{RMS}$), to predict the temperature of busbar 75. (As noted herein, the temperature of busbar 75 is not directly measurable in a practical manner and thereby the temperature of busbar 75 is "predicted".)

Figure 5:
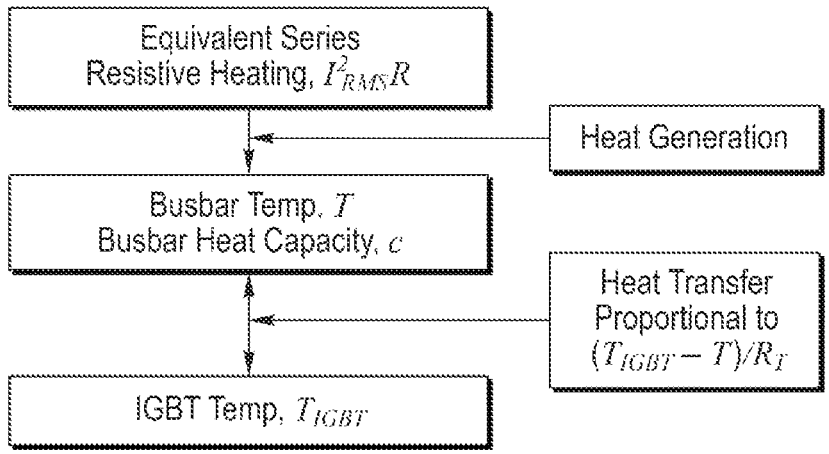
FIG. 5 illustrates a block diagram indicative of thermodynamics involving a power switch and a busbar of the inverter during operation of the electric drive system.

The procedure for obtaining the parameter information based on the busbar thermal model will now be described. For reference, FIG. 5 illustrates a block diagram indicative of thermodynamics involving busbar 75 and a power switch 66 of inverter 60 of electric drive system 13 of EV 12 during operation of the electric drive system.

The governing thermal equation for predicting the temperature of busbar 75 of inverter 60 from the IGBT temperature ($T_{IGBT}$) and the current output of the inverter ($I_{RMS}$) is:

$$\dot{T}_C = (T_{IGBT} - T)/R_T + I_{RMS}^2 R \quad (1)$$

As described, $I_{RMS}$ is the RMS (root-mean-square) value of the current output of inverter 60 outputted to motor 14 (or received by inverter 60 from generator 14).

Rearranging and grouping the variables provides the following thermal equation:

$$\dot{T} + \alpha T = \alpha(T_{IGBT} + I_{RMS}^2 R R_T) \quad (2)$$

The solution to the differential equation:

$$T(t) = T(0)e^{-\alpha t} + \alpha e^{-\alpha t}\int e^{\alpha t}(T_{IGBT}(t) + I_{RMS}^2(t)RR_T)dt \quad (3)$$

$R_T$ is thermal resistances with units [K/W], R is electrical resistance with units [V/A], c is thermal heat capacitance with units [W-s/K], and a is a thermal time constant with units [1/s], where $\alpha = 1/(c^*R_T)$. The constant $\alpha$ and the constant $RR_T$ are unknown. (The constant $RR_T$ is the bulk constant.) The temperature T(0) is the temperature of busbar 75 of inverter 60 at key-on.

The individual parameters used in the derivation cannot be solved for independently in this context (and it is unnecessary to do so) but they can be lumped into two parameters ($\alpha$ and $RR_T$) that can be fit to the recorded data obtained from testing eDrive unit test version 80 (e.g., recorded data such as recorded data plotted in exemplary graphs 90 and 92). In this regard, the unknown constants $\alpha$ and $RR_T$ are fitted to the recorded data obtained from testing eDrive unit test version 80. The unknown constants are fitted to the experimental data such as by use of a least square algorithm. For the particular hardware used to illustrate this exemplary example the unknown constants were determined to be:

$$\alpha = 0.0014[s^{-1}]$$

$$RR_T = 0.00080[KA^{-2}] \quad (4)$$

The busbar thermal model with fitted parameters $\alpha = 0.0014[s^{-1}]$ and $RR_T = 0.00080[KA^{-2}]$ fits the experimental data ($R^2 \sim 0.97$-$0.99$) relatively well when the initial temperature (T(0)) of busbar 75 of inverter 60 is known.

Figure 6:
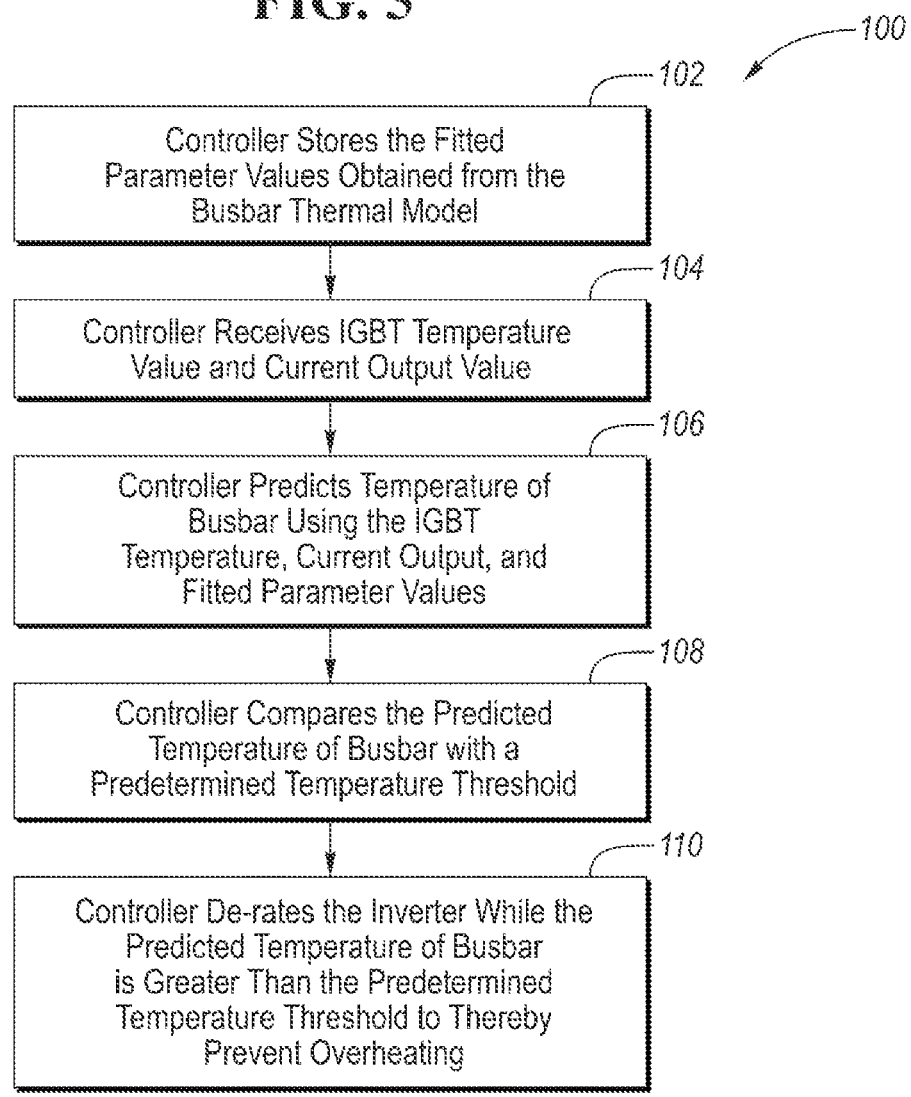
FIG. 6 is a flowchart depicting operation of a method and system for controlling the electric drive system according to a predicted temperature of the busbar of the inverter.

Referring now to FIG. 6, with continual reference to the preceding Figures, a flowchart 100 depicting operation of a method and a system for controlling electric drive system 13 of EV 12 according to a predicted temperature of busbar 75 of inverter 60 is shown. The operation includes controller 63 storing the values of fitted parameters $\alpha$ and $RR_T$ determined from the busbar thermal model, as indicated in block 102. As discussed above, these fitted parameters $\alpha$ and $RR_T$ are parameters of a thermal equation for determining a temperature of busbar 75. Other parameters of the busbar thermal equation include the temperature of the power switch of inverter 60 and the current output of inverter 60, which are known sensed quantities.

While electric drive system 13 of EV 12 is in use, the operation further includes controller 63 receiving a signal indicative of a temperature of a power switch 66 (i.e., the IGBT temperature ($T_{IGBT}$)) of a switching unit 64 of inverter 60 and a signal indicative of the current output ($I_{RMS}$) of inverter 60, as indicated in block 104. Controller 63 receives the signal indicative of the IGBT temperature ($T_{IGBT}$) from a temperature sensor directly measuring the temperature of the switch. Controller 63 receives the signal indicative of the inverter current output ($I_{RMS}$) from current sensor 70 directly measuring the current output of inverter 60.

The operation further includes controller 63 predicting a temperature (T(t)) of busbar 75 of inverter 60 while electric drive system 13 operates over time by using (i) the IGBT temperature ($T_{IGBT}$), (ii) the inverter current output ($I_{RMS}$), and (iii) the values of fitted parameters α and $RR_T$ determined from the busbar thermal model, as indicated in block 106. Particularly, controller 63 solves the differential equation (equation (3) above) using the IGBT temperature value ($T_{IGBT}$), the square of the inverter current output value (i.e., $I^2_{RMS}$), and the values of the fitted parameters to predict the temperature of busbar 75. In this regard, controller 63 implements a discrete version of a solution of the differential equation according to the following equations:

$$g_j = T_{IGBT}(t_j) + I^2_{RMS}(t_j)RR_T \quad (5)$$

$$\Delta t = t_j - t_{j-1}$$

$$\lambda = \alpha \Delta t$$

$$C_{TD} = \begin{cases} 1 & \text{if } \lambda \leq 0 \\ 1 - \lambda & \text{if } 0 < \lambda < 0.1 \\ 0.81/(\lambda + 0.8) & \text{if } 0.1 \leq \lambda \end{cases}$$

$$T_{ACBB}(t_j) = T_{ACBB}(t_{j-1})C_{TD} + g_j(1 - C_{TD})$$

$t_j$ is the present time that the temperature ($T_{ACBB}$) of busbar 75 of inverter 60 (i.e., "AC" busbar) is calculated and $t_{j-1}$ is the previous time that the temperature ($T_{ACBB}$) of busbar 75 was calculated. If no previous temperature history exists (e.g., first key-on event), then use: $t_j$=now( ); and $T_{ACBB}(t_j)$=min($T_{ACBB\_max}$, $T_{IGBT}(t_j)+T_{offset}$).

In an embodiment, the discrete solution (equations (5)) makes use of trapezoidal integration to solve the general differential thermal equation (equation (3)). This embodiment is not meant to be limiting as other discrete solutions are possible.

The operation further includes controller 63 comparing the predicted temperature of busbar 75 of inverter 60 with a predetermined temperature threshold, as indicated in block 108. Controller 63 de-rates inverter 60 while the predicted temperature of busbar 75 is greater than the predetermined temperature threshold to thereby prevent a temperature thereof and other components of inverter 60 from exceeding a threshold, as indicated in block 110. For example, controller 63 "de-rates" inverter 60 by reducing the input power received by the inverter from battery 24, modifying the switching schedule of the power switches of the inverter, or pausing operation of the inverter for a period of time, etc.

Of course, system controller 48 may be operable to perform any of these steps upon receiving from controller 63 a signal indicative of the predicted temperature of busbar 75 of inverter 60. As such, system controller 48 may de-rate inverter 60 and/or other components of electric drive system 13 while the predicted temperature of busbar 75 is greater than the predetermined temperature threshold.

As described, the temperature of busbar 75 of inverter 60 can be modeled based on information already known to EV 12, namely the power switch temperature and the inverter current output. The busbar thermal model may potentially replace time-based limits on RMS current that have been used to protect components of inverter 60, thereby maintaining protection of the inverter without unnecessarily compromising eDrive capability.

As described, components in inverter systems have been protected by either measuring the temperature of a busbar of the inverter directly or via an allowed amount of electrical current squared per unit of time. The expense of measuring the busbar temperature directly is prohibitive and limiting the amount of current allowed per unit time is overly conservative in many use cases.

As described, embodiments of the present invention therefore provide for predicting the busbar temperature to thereby maximize hardware usage while still protecting the hardware from abuse. In this regard, a reference temperature (i.e., the sensed temperature of power switch 66 of inverter 60) and a heating mechanism (i.e., the sensed current output of inverter 60) are used to predict a temperature of busbar 75 of inverter 60. In other embodiments, the reference temperature may be some other sensed temperature associated with the inverter such as a sensed temperature of vehicle or inverter hardware like a sensed coolant temperature or a sensed temperature of a component of the inverter other than the power switch. The predicted temperature of busbar 75 is related to the reference temperature and the heating mechanism by the busbar thermal equation. The busbar thermal equation has parameter values which represent the contribution of the reference temperature and heating mechanism to the predicted temperature of busbar 75. The parameter values are obtained from the busbar thermal model via directly measuring a busbar of a test version of inverter 60 (i.e., "the test inverter").

The testing of the test inverter includes collecting temperature data with a thermocouple on the busbar of the test inverter and collecting data which may contribute to heating including the reference temperature (e.g., the temperature of a power switch of the test inverter). The collected temperature data is then fitted with an analysis tool such as Matlab until the values of the parameters are determined that result in an acceptable fit error. The temperature estimation is then combined with a control strategy to effectively hold the heating mechanism constant or lower to thereby stop the predicted temperature from increasing. The control strategy is continuous during runtime to balance hardware protection with performance. The temperature estimation accuracy may be verified and validated when keyed on or with key on events by a user at various time intervals.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An electric drive system comprising:
an inverter including a power switch and a busbar; and
a controller configured to reduce power output of the inverter while a temperature of the busbar, predicted from a thermal equation given a sensed temperature of the power switch of the inverter, a sensed current output of the inverter, and values of parameters of the thermal equation obtained from a thermal model of the busbar, is greater than a threshold to thereby maintain busbar temperature lower than the threshold.

2. An electric drive system comprising:
an inverter including a power switch and a busbar; and
a controller configured to reduce power output of the inverter while a sensed temperature of the power switch of the inverter, a sensed current output of the inverter, and parameter values of the busbar are indicative of a predicted temperature of the busbar being greater than a threshold to maintain busbar temperature lower than the threshold;

wherein the parameter values of the busbar are obtainable from a thermal model of the busbar; and the thermal model of the busbar is derived from a test version of the inverter being tested under a plurality of drive cycles in which for each drive cycle a set of information is recorded including a sensed temperature of the power switch of the test version of the inverter, a sensed current output of the test version of the inverter, and a sensed temperature of the busbar of the test version of the inverter.

3. The electric drive system of claim 2 wherein:

the parameter values of the busbar are obtained from the thermal model of the busbar by finding which values of a busbar temperature thermal equation having variables of power switch temperature, inverter current output, and the parameters fit the set of information recorded for at least one of the drive cycles.

4. The electric drive system of claim 1 wherein:

the current output of the inverter is outputted over the busbar.

5. The electric drive system of claim 1 wherein:

the inverter is a multiphase inverter including a plurality of busbars respectively associated with phases of the inverter.

6. The electric drive system of claim 1 wherein:

the temperature of the power switch of the inverter is sensed by a temperature sensor incorporated with the power switch of the inverter.

7. The electric drive system of claim 1 wherein:

the current output of the inverter is sensed by a current sensor of the inverter.

8. The electric drive system of claim 1 wherein:

the controller is further configured to reduce power output of the inverter by de-rating operation of the inverter.

9. The electric drive system of claim 1 wherein:

the inverter is configured to convert an input electrical power received from a battery and/or a fuel cell system into an output electrical power and provide, via at least the busbar, the output electrical power to a motor.

10. A method for an inverter, the method comprising:

sensing a temperature of a power switch of the inverter;

sensing a current output of the inverter;

obtaining parameter values of a busbar of the inverter from a thermal model of the busbar, wherein the thermal model of the busbar is derived from a test version of the inverter being tested under a plurality of drive cycles in which for each drive cycle a set of information is recorded including a sensed temperature of the power switch of the test version of the inverter, a sensed current output of the test version of the inverter, and a sensed temperature of the busbar of the test version of the inverter; and reducing power output of the inverter while the sensed temperature of the power switch of the inverter, the sensed current output of the inverter, and the parameter values of the busbar of the inverter are indicative of a predicted temperature of the busbar being greater than a threshold to maintain busbar temperature lower than the threshold.

11. The method of claim 10 wherein:

obtaining the parameter values of the busbar from the thermal model of the busbar includes finding which values of a busbar temperature thermal equation having variables of power switch temperature, inverter current output, and the parameters fit the set of information recorded for at least one of the drive cycles.

12. The method of claim 10 wherein:

the current output of the inverter is outputted over the busbar.

13. The method of claim 10 further comprising:

converting, by the inverter, an input electrical power received from a battery into an output electrical power; and providing, from the converter via at least the busbar, the output electrical power to a motor.

* * * * *